United States Patent
Sasaoka

(10) Patent No.: US 9,552,927 B2
(45) Date of Patent: Jan. 24, 2017

(54) CERAMIC ELECTRONIC COMPONENT

(71) Applicant: Murata Manufacturing Co., Ltd., Nagaokakyo-shi, Kyoto-fu (JP)

(72) Inventor: Yoshikazu Sasaoka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 73 days.

(21) Appl. No.: 14/521,537

(22) Filed: Oct. 23, 2014

(65) Prior Publication Data

US 2015/0116901 A1  Apr. 30, 2015

(30) Foreign Application Priority Data

Oct. 29, 2013 (JP) .................. 2013-224613
Aug. 26, 2014 (JP) .................. 2014-171097

(51) Int. Cl.
*H01G 4/228* (2006.01)
*H01G 4/30* (2006.01)
*H01G 4/12* (2006.01)
*H01G 4/008* (2006.01)
*H01G 4/232* (2006.01)

(52) U.S. Cl.
CPC .............. *H01G 4/30* (2013.01); *H01G 4/0085* (2013.01); *H01G 4/12* (2013.01); *H01G 4/232* (2013.01)

(58) Field of Classification Search
CPC ................................ H01G 4/228; H01G 4/232
USPC ............................................ 361/301.4, 306.3
See application file for complete search history.

(56) References Cited

U.S. PATENT DOCUMENTS

| 2011/0266040 A1* | 11/2011 | Kim ...................... H01G 4/005 174/260 |
| 2012/0162855 A1* | 6/2012 | Suh ...................... H01G 4/008 361/305 |
| 2013/0027839 A1* | 1/2013 | Kim ...................... H01G 4/30 361/301.4 |
| 2013/0100578 A1 | 4/2013 | Suh et al. |
| 2013/0141837 A1* | 6/2013 | Lee ...................... H01G 4/012 361/321.2 |

FOREIGN PATENT DOCUMENTS

| JP | 2001284157 A | * 10/2001 |
| JP | 2013-089946 A | 5/2013 |

* cited by examiner

*Primary Examiner* — Eric Thomas
(74) *Attorney, Agent, or Firm* — Keating & Bennett, LLP

(57) ABSTRACT

A ceramic electronic component includes a first fired electrode layer disposed on top of a ceramic body. The first fired electrode layer includes first to fifth portions that are separate from each other. The first portion is disposed on top of a first end surface. The second portion is disposed on top of a first principal surface. The third portion is disposed on top of a second principal surface. The fourth portion is disposed on top of a first side surface. The fifth portion is disposed on top of a second side surface.

19 Claims, 3 Drawing Sheets

CERAMIC ELECTRONIC COMPONENT

BACKGROUND OF THE INVENTION

1. Field of the Invention

The present invention relates to a ceramic electronic component.

2. Description of the Related Art

In the related art, a multilayer ceramic electronic component includes outer electrodes that cover end surfaces of a ceramic body (see, for example, Japanese Unexamined Patent Application Publication No. 2013-89946). Each of the outer electrodes extends from the corresponding one of the end surfaces of the ceramic body onto first and second principal surfaces and first and second side surfaces.

The outer electrodes that cover the end surfaces of the ceramic body are typically formed by applying conductive paste to the end surfaces of the ceramic body and then performing a heat treatment on the conductive paste. When the heat treatment is performed, a stress is accumulated in the outer electrodes due to the difference in coefficient of linear expansion between the ceramic body and the outer electrodes. A multilayer ceramic capacitor in which a stress is accumulated in outer electrodes may experience changes in external environment such as changes in temperature, which may cause a crack to occur in the ceramic body due to the stress accumulated in the outer electrode.

SUMMARY OF THE INVENTION

Accordingly, a preferred embodiment of the present invention provides a ceramic electronic component in which the occurrence of cracks is significantly reduced or prevented.

A ceramic electronic component according to a preferred embodiment of the present invention includes a ceramic body, and an outer electrode. The ceramic body includes first and second principal surfaces, first and second side surfaces, and first and second end surfaces. The first and second principal surfaces extend in a length direction and in a width direction. The first and second side surfaces extend in the length direction and in a thickness direction. The first and second end surfaces extend in the width direction and in the thickness direction. The outer electrode is disposed on the ceramic body. The outer electrode includes a fired electrode layer. The fired electrode layer is disposed on the ceramic body. The fired electrode layer includes first to fifth portions. The first portion is disposed on the first end surface. The second portion is disposed on the first principal surface. The second portion includes at least a portion that is separate from the first portion. The third portion is disposed on the second principal surface. The third portion includes at least a portion that is separate from the first portion. The fourth portion is disposed on the first side surface. The fourth portion includes at least a portion that is separate from each of the first to third portions. The fifth portion is disposed on the second side surface. The fifth portion includes at least a portion that is separate from each of the first to third portions.

Preferably, the outer electrode further includes a Cu plating layer arranged to cover the first to fifth portions.

The Cu plating layer may be arranged to cover at least one of the separate portions between the first to fifth portions.

Preferably, the fired electrode layer has a maximum thickness of about 20 μm or less, for example.

The ceramic electronic component is preferably buried in a substrate.

Preferably, an edge portion defined by the first end surface and one of the first principal surface, the second principal surface, the first side surface, and the second side surface has a rounded shape having an equivalent radius of curvature of about 5 μm to about 20 μm, for example.

A preferred embodiment of the present invention provides a ceramic electronic component in which the occurrence of cracks is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
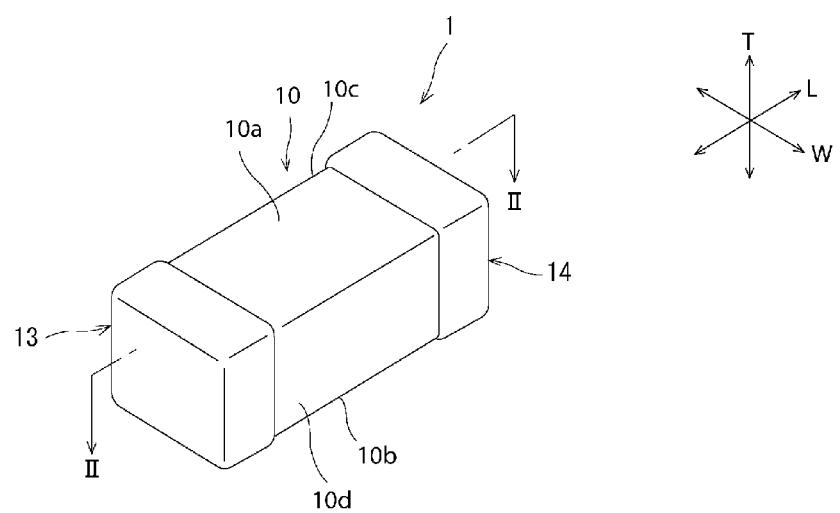
FIG. 1 is a schematic perspective view of a multilayer ceramic electronic component according to a preferred embodiment of the present invention.

Examples of preferred embodiments of the present invention will be described hereinafter. The following preferred embodiments are merely non-limiting examples. The present invention is not limited to the following preferred embodiments.

In the drawings that will be referred to in the following preferred embodiments and the like, members having the same or substantially the same function will be referred to by the same reference signs. In addition, the drawings that will be referred to in the following preferred embodiments and the like are schematically illustrated. The dimensional ratios and the like of objects illustrated in the drawings may sometimes be different from the actual dimensional ratios and the like of the objects. The dimensional ratios and the like of the objects may also sometimes differ between the drawings. The specific dimensional ratios and the like of the objects should be determined by taking the following description into consideration.

A ceramic electronic component according to this preferred embodiment may be a multilayer ceramic capacitor or any other ceramic electronic component such as a piezoelectric component, a thermistor, or an inductor. In the following, a description will be given of a ceramic electronic component according to this preferred embodiment that is a multilayer ceramic capacitor, by way of example.

The configuration of a multilayer ceramic capacitor 1 will now be described.

Figure 2:
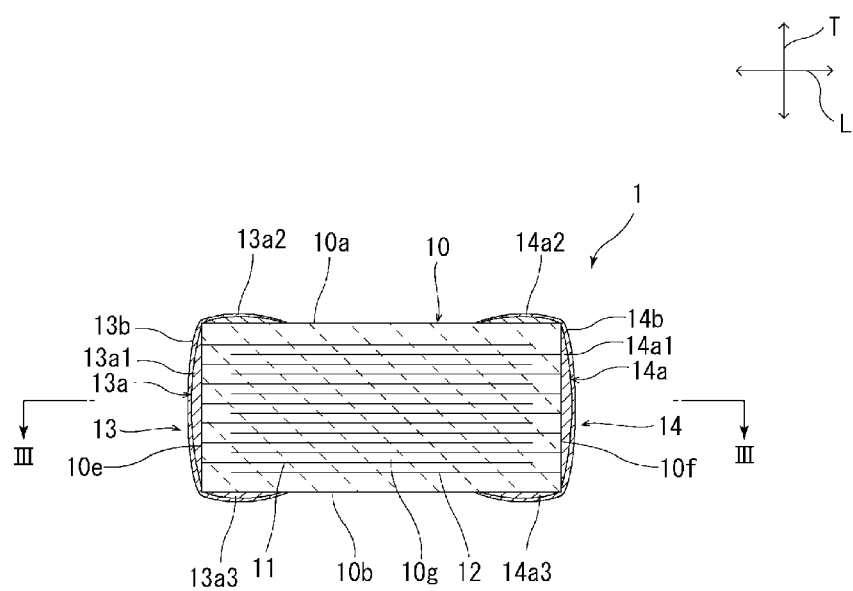
FIG. 2 is a schematic cross-sectional view taken along line II-II of FIG. 1.
Figure 3:
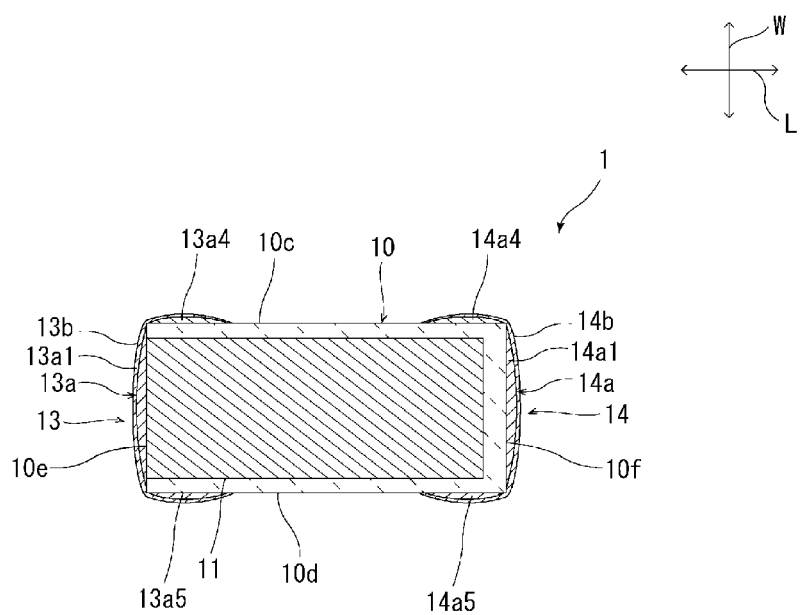
FIG. 3 is a schematic cross-sectional view taken along line III-III of FIG. 2.

FIG. 1 is a schematic perspective view of a multilayer ceramic capacitor 1 according to a preferred embodiment of the present invention. FIG. 2 is a schematic cross-sectional view of the multilayer ceramic capacitor 1 taken along line II-II of FIG. 1. FIG. 3 is a schematic cross-sectional view of the multilayer ceramic capacitor 1 taken along line III-III of FIG. 2.

As illustrated in FIG. 1 to FIG. 3, the multilayer ceramic capacitor 1 includes a ceramic body 10 preferably having a rectangular or substantially a rectangular parallelepiped shape. The ceramic body 10 includes a first principal surface 10a, a second principal surface 10b, a first side surface 10c, a second side surface 10d, a first end surface 10e, and a second end surface 10f. The first and second principal surfaces 10a and 10b extend in a length direction L and in a width direction W. The first and second side surfaces 10c and 10d extend in a thickness direction T and in the length direction L. The first and second end surfaces 10e and 10f extend in the thickness direction T and in the width direction W. The length direction L, the width direction W, and the thickness direction T are perpendicular to one another.

The term "rectangular parallelepiped shape", as used herein, includes a rectangular parallelepiped with rounded corner portions and edge portions. That is, a member having substantially a "rectangular parallelepiped shape" means a general member having first and second principal surfaces, first and second side surfaces, and first and second end surfaces. In addition, the principal surfaces, side surfaces, and end surfaces may have, in part or entirety, irregularities or the like.

The dimensions of the ceramic body 10 are not particularly limited. For example, the ceramic body 10 preferably has a thickness of approximately 0.1 mm to approximately 0.5 mm, a length of approximately 0.4 mm to approximately 1.0 mm, and a width of approximately 0.2 mm to approximately 0.5 mm.

The ceramic body 10 is made of an appropriate ceramic in accordance with the function of the multilayer ceramic capacitor 1. Specifically, in a case where the multilayer ceramic capacitor 1 is a capacitor, the ceramic body 10 may be formed of a dielectric ceramic. Specific examples of the dielectric ceramic include $BaTiO_3$, $CaTiO_3$, $SrTiO_3$, and $CaZrO_3$. The ceramic body 10 may optionally contain a sub-component, such as a Mn compound, a Mg compound, a Si compound, an Fe compound, a Cr compound, a Co compound, a Ni compound, or a rare-earth compound, in accordance with the characteristics required for the multilayer ceramic capacitor 1.

In a case where the multilayer ceramic capacitor 1 is a piezoelectric component, the ceramic body 10 may be formed of a piezoelectric ceramic. Specific examples of the piezoelectric ceramic include lead zirconate titanate (PZT) based ceramics.

For example, in a case where the multilayer ceramic capacitor 1 is a thermistor, the ceramic body 10 may be formed of a semiconductor ceramic. Specific examples of the semiconductor ceramic include spinel based ceramics.

For example, in a case where the multilayer ceramic capacitor 1 is an inductor, the ceramic body 10 may be formed of a magnetic ceramic. Specific examples of the magnetic ceramic include ferrite ceramics.

As illustrated in FIG. 2, the ceramic body 10 includes, in the inside thereof, a plurality of first inner electrodes 11 and a plurality of second inner electrodes 12.

The first inner electrodes 11 preferably are rectangular or substantially rectangular in shape. The first inner electrodes 11 are disposed parallel or substantially parallel to the first and second principal surfaces 10a and 10b (see FIG. 1). That is, the first inner electrodes 11 are disposed in the length direction L and the width direction W. The first inner electrodes 11 are exposed on the first end surface 10e, and are not exposed on the first or second principal surface 10a or 10b, the first or second side surface 10c or 10d, or the second end surface 10f.

The second inner electrodes 12 preferably are rectangular or substantially rectangular in shape. The second inner electrodes 12 are disposed parallel or substantially parallel to the first and second principal surfaces 10a and 10b (see FIG. 1). That is, the second inner electrodes 12 are disposed in the length direction L and the width direction W. Accordingly, the second inner electrodes 12 and the first inner electrodes 11 are parallel or substantially parallel to each other. The second inner electrodes 12 are exposed on the second end surface 10f, and are not exposed on the first or second principal surface 10a or 10b, the first or second side surface 10c or 10d, or the first end surface 10e.

The first inner electrodes 11 and the second inner electrodes 12 are alternately disposed in the thickness direction T. Each of the first inner electrodes 11 and each of the second inner electrodes 12 that are adjacent in the thickness direction T face each other with a ceramic portion 10g located therebetween. The ceramic portion 10g preferably has a thickness of approximately 0.4 μm to approximately 0.8 μm, and preferably has a thickness of approximately 0.3 μm to approximately 0.5 μm, for example.

The first inner electrodes 11 and the second inner electrodes 12 may be formed of an appropriate conductive material. The first inner electrodes 11 and the second inner electrodes 12 may be formed of a metal selected from the group consisting of, for example, Ni, Cu, Ag, Pd, and Au, or may be formed of an alloy of one or more metals selected from the group consisting of Ni, Cu, Ag, Pd, and Au (for example, a Ag—Pd alloy).

Each of the first and second inner electrodes 11 and 12 preferably has a thickness of, for example, approximately 0.2 μm to approximately 2.0 μm.

As illustrated in FIG. 2 and FIG. 3, the multilayer ceramic capacitor 1 includes a first outer electrode 13 and a second outer electrode 14. The first and second outer electrodes 13 and 14 may be formed of an appropriate conductive material.

The first and second outer electrodes 13 and 14 are disposed on top of the ceramic body 10. The first outer electrode 13 is electrically connected to the first inner electrodes 11 on the first end surface 10e.

The first outer electrode 13 includes a first fired electrode layer 13a and a first Cu plating layer 13b. The first fired electrode layer 13a includes a first portion 13a1, a second portion 13a2, a third portion 13a3, a fourth portion 13a4, and a fifth portion 13a5.

The first portion 13a1 is disposed on top of the first end surface 10e. The second portion 13a2 is disposed on top of the first principal surface 10a, and includes at least a portion that is separate from the first portion 13a1. The third portion 13a3 is disposed on top of the second principal surface 10b, and is separate from the first portion 13a1. The fourth portion 13a4 is disposed on top of the first side surface 10c, and includes at least a portion that is separate from each of the first to third portions 13a1, 13a2, and 13a3. The fifth portion 13a5 is disposed on top of the second side surface 10d, and includes at least a portion that is separate from each of the first to third portions 13a1, 13a2, and 13a3. The first to fifth portions 13a1, 13a2, 13a3, 13a4, and 13a5 do not cover the corner portions or edge portions of the ceramic body 10.

The first Cu plating layer 13b covers the first to fifth portions 13a1, 13a2, 13a3, 13a4, and 13a5 and the corner portions and edge portions of the ceramic body 10. The first Cu plating layer 13b covers at least some of the portions of the first to fifth portions 13a1, 13a2, 13a3, 13a4, and 13a5, each of which is separate from another.

On the other hand, the second outer electrode 14 is electrically connected to the second inner electrodes 12 on the second end surface 10f.

The second outer electrode 14 includes a second fired electrode layer 14a and a second Cu plating layer 14b. The second fired electrode layer 14a includes a first portion

14a1, a second portion 14a2, a third portion 14a3, a fourth portion 14a4, and a fifth portion 14a5.

The first portion 14a1 is disposed on top of the second end surface 10f. The second portion 14a2 is disposed on top of the first principal surface 10a, and is separate from the first portion 14a1. The third portion 14a3 is disposed on top of the second principal surface 10b, and is separate from the first portion 14a1. The fourth portion 14a4 is disposed on top of the first side surface 10c, and is separate from each of the first to third portions 14a1, 14a2, and 14a3. The fifth portion 14a5 is disposed on top of the second side surface 10d, and is separate from each of the first to third portions 14a1, 14a2, and 14a3. The first to fifth portions 14a1, 14a2, 14a3, 14a4, and 14a5 do not cover the corner portions or edge portions of the ceramic body 10.

The second Cu plating layer 14b covers the first to fifth portions 14a1, 14a2, 14a3, 14a4, and 14a5 and the corner portions and edge portions of the ceramic body 10.

For the formation of the first and second fired electrode layers 13a and 14a, for example, a layer of conductive paste containing a conductive component and glass is formed and is then subjected to firing. Examples of the conductive component of the first and second fired electrode layers 13a and 14a may include Cu, Ni, Ag, Pd, Ag—Pd alloy, and Au. Examples of the glass of the first and second fired electrode layers 13a and 14a may include glass containing B, Si, Ba, Mg, Al, and Li.

The first and second fired electrode layers 13a and 14a may be sintered simultaneously with the ceramic body 10, or may be produced by forming a conductive paste layer on top of a ceramic body, after the ceramic body is obtained by sintering, and then subjecting the conductive paste layer to firing.

Each of the first and second fired electrode layers 13a and 14a preferably has a maximum thickness of approximately 20 µm or less, for example.

A change in the temperature of a multilayer ceramic capacitor may cause a crack to occur in the multilayer ceramic capacitor. The cause of the crack may be as follows. Due to the difference in coefficient of linear expansion between the metal contained in a fired electrode layer and a ceramic body, in some cases, the shrinkage of the fired electrode layer that has been subjected to firing may be greater than the shrinkage of the ceramic body when cooled. In these cases, the fired electrode layer whose shrinkage is large experiences tensile stress, which causes the ceramic body whose shrinkage is small to be pulled toward the fired electrode layer, causing compressive stress on the ceramic body.

In the related art, when a fired electrode layer that extends from a first or second end surface to first and second principal surfaces and first and second side surfaces is cooled, each portion of the fired electrode layer shrinks as follows. The portion of the fired electrode layer located on top of the first or second end surface shrinks toward the center thereof. Similarly, the portion of the fired electrode layer located on top of the first principal surface also shrinks toward the center thereof. Accordingly, a force caused by the shrinkage of the portion located on top of the first or second end surface and a force caused by the shrinkage of the portion located on top of the first principal surface are applied to portions of the fired electrode layer located on top of the corner portions and edge portion between the first or second end surface and the first principal surface. Thus, a large stress is likely to be accumulated in the portions of the fired electrode layer located on top of the corner portions and edge portion between the first or second end surface and the first principal surface. A large stress is also likely to be accumulated in the corresponding edge portion and corner portions of the ceramic body. This stress is also likely to be accumulated in the other corner portions and edge portions in the manner similar to that described above. If the stress exceeds the intensity of the fired electrode layer or exceeds the intensity of the ceramic body, a crack occurs in the fired electrode layer or the ceramic body.

In this preferred embodiment, first to fifth portions that are separate from each other are provided. The provision of the first to fifth portions prevents or reduces the accumulation of stress in the portions located on top of the corner portions and edge portions of the ceramic body and the corner portions and edge portions of the fired electrode layers, compared to related art devices configured such that an outer electrode is configured to extend from a first or second end surface to first and second principal surfaces and first and second side surfaces. Accordingly, this preferred embodiment preferably provides a multilayer ceramic capacitor in which the occurrence of cracks is significantly reduced or prevented.

As with Ni plating layers, plating growth is likely to occur in the thickness direction, whereas plating growth is not likely to occur in the plane direction. Due to these characteristics, if a Ni plating layer is formed over a fired electrode layer having first to fifth portions that are separate from each other, Ni plating layer portions formed on the respective portions and a Ni plating layer portion formed on the other portion are not connected to each other, and are likely to be spaced away from each other.

As with a Cu plating layer, in contrast, plating growth is likely to occur in the plane direction. Thus, the first Cu plating layer 13b is easily formed over the first fired electrode layer 13a including the first to fifth portions 13a1 to 13a5 so as to cover the first to fifth portions 13a1 to 13a5. Accordingly, the first outer electrode 13 in which the first to fifth portions 13a1 to 13a5 are electrically connected to one another can be easily formed.

Also, the second Cu plating layer 14b is easily formed over the second fired electrode layer 14a including the first to fifth portions 14a1 to 14a5 so as to cover the first to fifth portions 14a1 to 14a5. Accordingly, the second outer electrode in which the first to fifth portions 14a1 to 14a5 are electrically connected to one another are easily formed.

While the multilayer ceramic capacitor 1 according to the present preferred embodiment has been described, another preferred embodiment provides a multilayer ceramic capacitor configured such that first inner electrodes are exposed on both first and second end surfaces and second inner electrodes are exposed on both first and second side surfaces. The multilayer ceramic capacitor according to the other preferred embodiment may also have the first to fifth portions described above. In this multilayer ceramic capacitor, an outer electrode is disposed on each of the first and second side surfaces so that the outer electrode is electrically connected to the second inner electrodes. One of the pair of outer electrodes, which are disposed on the first and second side surfaces, and one of the first and second outer electrodes, which are disposed on the first and second end surfaces, are signal terminal electrodes, and the other outer electrodes are ground terminal electrodes.

The multilayer ceramic capacitor 1 is preferably buried in a substrate.

Moisture and the like are allowed to enter the multilayer ceramic capacitor 1 including the first portion 14a1, the second portion 14a2, the third portion 14a3, the fourth portion 14a4, and the fifth portion 14a5 that are separate from each other. As a result, insulation resistance is reduced. However, the multilayer ceramic capacitor 1 when buried in a substrate has substantially no opportunity to contact moisture, achieving the advantage that reduction in insulation resistance is less likely to occur even when the first portion 14a1, the second portion 14a2, the third portion 14a3, the fourth portion 14a4, and the fifth portion 14a5 are separate from each other.

A non-limiting example of a method for manufacturing the multilayer ceramic capacitor 1 is not particularly limited. For example, the multilayer ceramic capacitor 1 may be manufactured in the following way.

First, the ceramic body 10 including the first and second inner electrodes 11 and 12 is prepared. Specifically, ceramic paste containing a ceramic powder is applied in the shape of a sheet using, for example, a screen printing method and is dried to produce ceramic green sheets.

Then, conductive paste for forming inner electrodes is applied to the ceramic green sheets in a predetermined pattern using, for example, a screen printing method. Thus, ceramic green sheets on which a conductive pattern for forming inner electrodes (hereinafter referred to as the "inner-electrode formation conductive pattern") is formed and ceramic green sheets on which the inner-electrode formation conductive pattern is not formed are prepared. The ceramic paste and the conductive paste for forming inner electrodes may contain, for example, a well-known binder or solvent.

Subsequently, a predetermined number of ceramic green sheets on which the inner-electrode formation conductive pattern is not formed are stacked, on top of which the ceramic green sheets on which the inner-electrode formation conductive pattern is formed are sequentially stacked, and a predetermined number of ceramic green sheets on which the inner-electrode formation conductive pattern is not formed are further stacked. Accordingly, a mother multilayer body is produced. The mother multilayer body may be pressed in the stacking direction, if necessary, using a technique such as isostatic pressing.

The mother multilayer body is cut into predetermined shapes and dimensions to produce a plurality of raw ceramic bodies. Each of the raw ceramic bodies may be polished by barrel polishing or the like to round off edge portions and corner portions thereof.

Then, the raw ceramic body is sintered. Accordingly, the ceramic body 10 is completed. The sintering temperature of the raw ceramic body can be set as appropriate in accordance with the ceramic and conductive material used. The sintering temperature of the raw ceramic body may be, for example, approximately 900° C. to approximately 1300° C.

Then, the sintered multilayer body is held by, for example, a suction pad, and the held multilayer body is dipped into a conductive paste vessel. Accordingly, a conductive paste layer corresponding to the first to fifth portions 13a1, 13a2, 13a3, 13a4, and 13a5 described above is formed. A conductive paste layer corresponding to the first to fifth portions 14a1, 14a2, 14a3, 14a4, and 14a5 is also formed by dipping the multilayer body into the conductive paste vessel.

In this case, the amount of conductive paste is controlled so that the maximum value of the thickness of each of the first to fifth portions is approximately 5 μm to approximately 10 μm, for example, after the conductive paste is subjected to firing described below.

Preferable conditions for forming the first to fifth portions described above so as not to cover the corner portions and edge portions of the ceramic body 10 are as follows.

An edge portion defined by the first or second end surface 10e or 10f and the first principal surface 10a, the second principal surface 10b, the first side surface 10c, or the second side surface 10d preferably has a rounded shape having an equivalent radius of curvature of approximately 5 μm to approximately 20 μm, for example. More preferably, the equivalent radius of curvature is approximately 8 μm to approximately 12 μm, for example. The multilayer body dipped into the conductive paste vessel is preferably pulled up at a rate of approximately 10 mm/s or less, for example. The viscosity of the conductive paste is preferably approximately 10 Pa·s or less, for example.

Note that the equivalent radius of curvature can be determined by removing a polishing residue on a polished surface that is exposed as a result of polishing the first side surface 10c or the second side surface 10d of the multilayer ceramic capacitor 1 up to the center in the width direction W and thereafter by measuring the radius of a virtual circle that passes through three points, that is, the center and both ends of the edge portion, on the polished surface.

Then, the first and second fired electrode layers 13a and 14a are subjected to firing. The firing temperature is preferably, for example, approximately 700° C. to approximately 1000° C., for example.

Subsequently, the first Cu plating layer 13b is formed so as to cover the first to fifth portions 13a1, 13a2, 13a3, 13a4, and 13a5 and the corner portions and edge portions of the ceramic body 10. The second Cu plating layer 14b is formed so as to cover the first to fifth portions 14a1, 14a2, 14a3, 14a4, and 14a5 and the corner portions and edge portions of the ceramic body 10.

Through the steps described above, the multilayer ceramic capacitor 1 is produced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic electronic component comprising:
   a ceramic body including a first principal surface and a second principal surface that extend in a length direction and in a width direction, a first side surface and a second side surface that extend in the length direction and in a thickness direction, and a first end surface and a second end surface that extend in the width direction and in the thickness direction; and
   an outer electrode disposed on the ceramic body and including a fired electrode layer disposed on the ceramic body; wherein
   the fired electrode layer includes:
      a first portion disposed on the first end surface;
      a second portion disposed on the first principal surface;
      a third portion disposed on the second principal surface;
      a fourth portion disposed on the first side surface; and
      a fifth portion disposed on the first side surface;
   when viewed in a cross section along the length direction and the thickness direction, the first portion and the second portion are not directly connected to each other, and are separate from each other;
   when viewed in a cross section along the length direction and the thickness direction, the first portion and the third portion are not directly connected to each other, and are separate from each other;

when viewed in a cross section along the length direction and the width direction, the the first portion and the fourth portion are not directly connected to each other, and are separate from each other;

when viewed in a cross section along the length direction and the width direction, the first portion and the fifth portion are not directly connected to each other, and are separate from each other;

when viewed in a cross section along the width direction and the thickness direction, the second portion and the fourth portion are not directly connected to each other, and are separate from each other;

when viewed in a cross section along the width direction and the thickness direction, the third portion and the fourth portion are not directly connected to each other, and are separate from each other;

when viewed in a cross section along the width direction and the thickness direction, the second portion and the fifth portion are not directly connected to each other, and are separate from each other; and when viewed in a cross section along the width direction and the thickness direction, the third portion and the fifth portion are not directly connected to each other, and are separate from each other.

2. The ceramic electronic component according to claim 1, wherein the outer electrode further includes a Cu plating layer arranged to cover the first portion, the second portion, the third portion, the fourth portion, and the fifth portion.

3. The ceramic electronic component according to claim 2, wherein the Cu plating layer is arranged to cover at least one of the separate portions between the first portion, the second portion, the third portion, the fourth portion, and the fifth portion.

4. The ceramic electronic component according to claim 1, wherein the fired electrode layer has a maximum thickness of about 20 μm or less.

5. The ceramic electronic component according to claim 1, wherein the ceramic electronic component is buried in a substrate.

6. The ceramic electronic component according to claim 1, wherein an edge portion defined by the first end surface and one of the first principal surface, the second principal surface, the first side surface, and the second side surface has a rounded shape having an equivalent radius of curvature of about 5 μm to about 20 μm.

7. The ceramic electronic component according to claim 1, wherein the ceramic electronic component is one of a multilayer ceramic capacitor, a piezoelectric component, a thermistor and an inductor.

8. The ceramic electronic component according to claim 1, wherein the ceramic body has a thickness of approximately 0.1 mm to approximately 0.5 mm, a length of approximately 0.4 mm to approximately 1.0 mm, and a width of approximately 0.2 mm to approximately 0.5 mm.

9. The ceramic electronic component according to claim 1, wherein the ceramic body is made of one of a dielectric ceramic, a piezoelectric ceramic, a semiconductor ceramic, and a magnetic ceramic.

10. The ceramic electronic component according to claim 1, wherein the ceramic body includes first and second inner electrodes alternately disposed in the thickness direction.

11. The ceramic electronic component according to claim 10, wherein each of the first inner electrodes and each of the second inner electrodes that are adjacent in the thickness direction face each other with a ceramic portion located therebetween.

12. The ceramic electronic component according to claim 11, wherein the ceramic portion has a thickness of approximately 0.4 μm to approximately 0.8 μm.

13. The ceramic electronic component according to claim 11, wherein the ceramic portion has a thickness of approximately 0.3 μm to approximately 0.5 μm.

14. The ceramic electronic component according to claim 10, wherein each of the first and second inner electrodes has a thickness of approximately 0.2 μm to approximately 2.0 μm.

15. The ceramic electronic component according to claim 1, further comprising another outer electrode including a fired electrode layer and a Cu plating layer.

16. The ceramic electronic component according to claim 15, wherein the first electrode layer of the another outer electrode includes:
a first portion disposed on the second end surface;
a second portion disposed on the first principal surface and including at least a portion that is separate from the first portion;
a third portion disposed on the second principal surface and including at least a portion that is separate from the first portion;
a fourth portion disposed on the first side surface and including at least a portion that is separate from each of the first portion, the second portion, and the third portion; and
a fifth portion disposed on the second side surface and including at least a portion that is separate from each of the first portion, the second portion, and the third portion.

17. The ceramic electronic component according to claim 16, wherein the Cu plating layer of the another outer electrode covers the first, second, third, fourth and fifth portions and corner portions and edge portions of the ceramic body.

18. The ceramic electronic component according to claim 1, wherein a thickness of the fired electrode layer is approximately 20 μm.

19. The ceramic electronic component according to claim 15, wherein a thickness of the fired electrode layer of the another outer electrode is approximately 20 μm.

* * * * *